(12) United States Patent
Rolandi et al.

(10) Patent No.: US 7,397,702 B2
(45) Date of Patent: Jul. 8, 2008

(54) READ/VERIFY CIRCUIT FOR MULTILEVEL MEMORY CELLS WITH RAMP READ VOLTAGE, AND READ/VERIFY METHOD THEREOF

(75) Inventors: Paolo Rolandi, Voghera (IT); Luigi Pascucci, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 77 days.

(21) Appl. No.: 11/178,240

(22) Filed: Jul. 8, 2005

(65) Prior Publication Data

US 2006/0028872 A1    Feb. 9, 2006

(30) Foreign Application Priority Data

Jul. 8, 2004    (IT) .......................... TO2004A0470

(51) Int. Cl.
*G11C 11/34* (2006.01)
*G11C 16/04* (2006.01)

(52) U.S. Cl. .............................. 365/185.22; 365/185.2; 365/185.21; 365/185.03; 365/185.19

(58) Field of Classification Search .................. 365/185
See application file for complete search history.

(56) References Cited

U.S. PATENT DOCUMENTS

| 5,508,958 | A | * | 4/1996 | Fazio et al. | ............ | 365/185.19 |
|---|---|---|---|---|---|---|
| 5,751,635 | A | * | 5/1998 | Wong et al. | ............ | 365/185.19 |
| 5,856,946 | A | * | 1/1999 | Chan et al. | ............ | 365/185.19 |
| 5,973,959 | A | * | 10/1999 | Gerna et al. | ........... | 365/185.03 |
| 6,172,908 | B1 | * | 1/2001 | Cappelletti et al. | ..... | 365/185.19 |
| 6,275,415 | B1 | * | 8/2001 | Haddad et al. | ......... | 365/185.11 |
| 6,275,417 | B1 | * | 8/2001 | Lee et al. | ............... | 365/185.19 |
| 6,392,931 | B1 | * | 5/2002 | Pasotti et al. | ........... | 365/185.19 |
| 6,515,902 | B1 | * | 2/2003 | Van Buskirk et al. | .. | 365/185.18 |
| 6,646,495 | B2 | * | 11/2003 | Perez | .......................... | 327/541 |
| 2006/0171204 | A1 | * | 8/2006 | Del Gatto et al. | ...... | 365/185.18 |
| 2006/0198187 | A1 | * | 9/2006 | Sforzin et al. | ............ | 365/185.2 |
| 2006/0209594 | A1 | * | 9/2006 | Pio et al. | ............... | 365/185.03 |
| 2006/0250852 | A1 | * | 11/2006 | Vimercati et al. | ...... | 365/185.19 |

* cited by examiner

*Primary Examiner*—Huan Hoang
*Assistant Examiner*—Michael Weinberg
(74) *Attorney, Agent, or Firm*—Lisa K. Jorgenson; James H. Morris; Wolf, Greenfield & Sacks, P.C.

(57) ABSTRACT

A read/verify circuit for multilevel memory cells includes: a read terminal selectively connectable to a plurality of array cells, having respective array threshold voltages; a plurality of reference cells, having respective reference threshold voltages; and a plurality of threshold-detection circuits, for detecting the array thresholds and the reference thresholds. In particular, the read terminal and the reference cells are each connected to a respective threshold-detection circuit. Each threshold-detection circuit is provided with a respective detector element of a resistive type, set so as to be traversed by a current response to turning-on of the respective array cell or reference cell associated thereto.

14 Claims, 4 Drawing Sheets

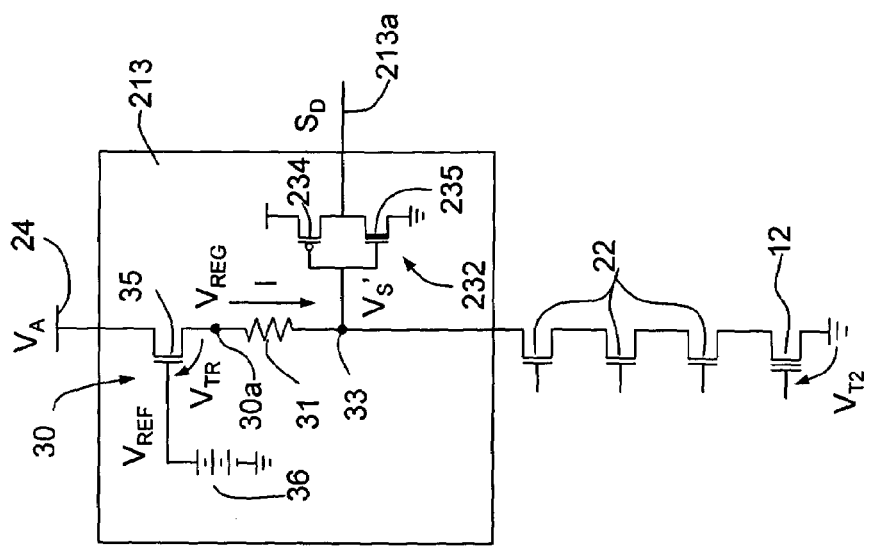
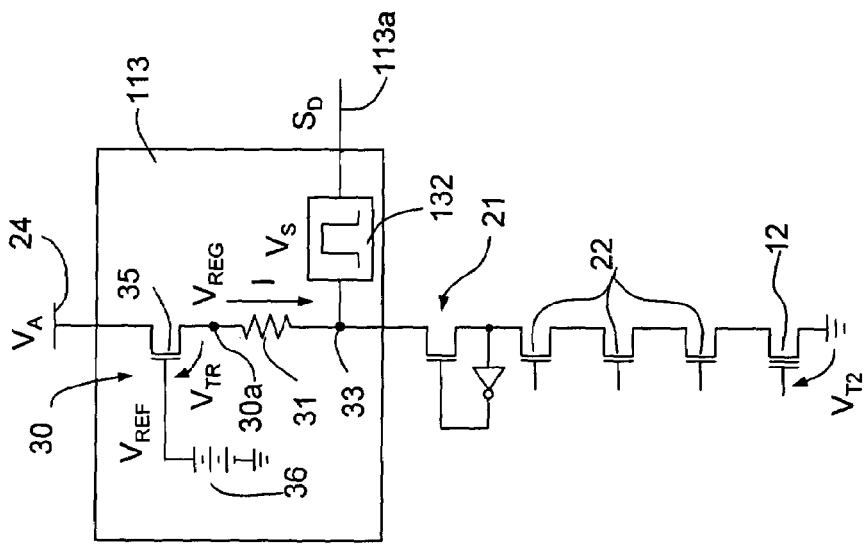
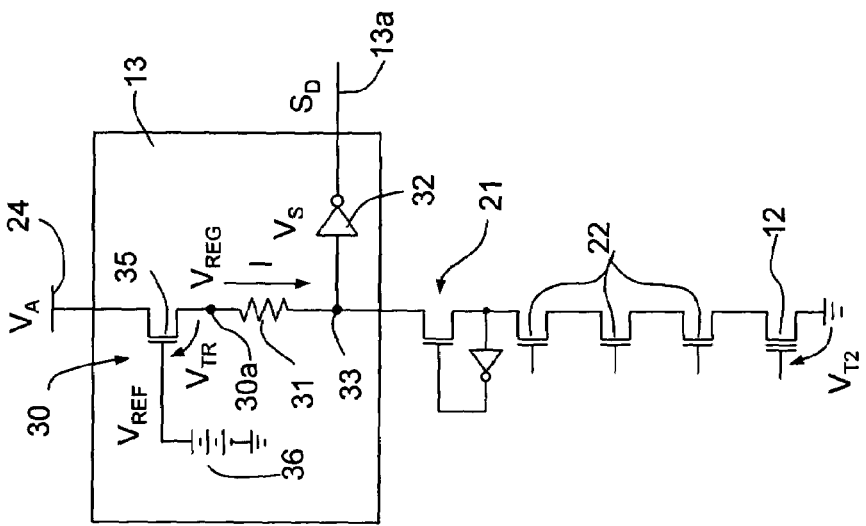
Fig.7
Fig.5
Fig.4

READ/VERIFY CIRCUIT FOR MULTILEVEL MEMORY CELLS WITH RAMP READ VOLTAGE, AND READ/VERIFY METHOD THEREOF

BACKGROUND OF THE INVENTION

1. Field of the Invention

The present invention relates to a read/verify circuit for multilevel memory cells with ramp read voltage and to a read/verify method thereof.

2. Discussion of the Related Art

As is known, the need to increase the capacity of non-volatile memories has led to the fabrication of multilevel memories, in which each cell is able to store more than one bit. The information, stored as an amount of charge in a floating-gate region, is encoded by fractioning the entrapped charge and, consequently, the threshold voltage. In this way, the characteristic of a multilevel cell is described by a number of curves representing the drain current as a function of the gate voltage and associated each to a different logic value. The result obtainable in terms of storage density is obviously better, the higher the number of levels of each cell.

At the same time, the development of techniques of fabrication of semiconductors, in particular the increase in lithographic precision, has enabled a considerable reduction in the dimensions of the individual cells and has made it possible for increasingly compact devices to be obtained.

The further increase in the storage density in non-volatile memories meets, however, with a limit in the precision required in particular for the read/verify circuits, which are traditionally based upon current comparison. In fact, the increase in the number of levels and the decrease in the gain of the cells caused by the reduction of the dimensions require discriminating currents that are increasingly closer to one another.

Recently, read/verify circuits with ramp read voltage have been proposed. In practice, the same ramp read voltage is supplied simultaneously to the gate terminals of a cell selected in a memory array and of a plurality of reference cells. The reference cells have been previously programmed so as to have intermediate threshold voltages between the possible threshold voltages envisaged for the array cells. As the read voltage increases, the reference cells are turned on in sequence; also the selected array cell is activated, but its turning-on is staggered with respect to the reference cells. In subsequent turning-on instants, then, the reference cells and the array cell start conducting the same reference current, which is injected through a plurality of respective current-mirror circuits. The passage of the current through each cell, whether an array cell or a reference cell, is detected by a respective operational amplifier, which compares the voltage on the drain terminal of the cell itself with a reference voltage. As the read voltage increases, the operational amplifiers associated to the reference cells switch in sequence, and the switching is stored in an appropriate register, which is incremented. When, instead, the operational amplifier associated with the memory cell switches, the register is "frozen" and is no longer modified until there is a reset command for a new read/verify cycle. In practice, the final configuration of the register indicates the relative position of the voltage threshold of the array cell with respect to the threshold voltages of the reference cells and consequently corresponds to the data stored.

The read/verify circuits with ramp read voltage, albeit presenting advantages as compared to the current comparison circuits, suffer from some limitations, due principally to the presence of operational amplifiers and of current-mirror circuits. Operational amplifiers, in fact, are complex and cumbersome, have high power consumption and, moreover, tend to introduce offsets that limit the maximum obtainable precision. Consequently, also the number of levels that can be discriminated is not optimal. Current mirrors, instead, are sensitive to the fluctuations of the supply voltage and can thus easily introduce read errors when the levels of the threshold voltage are close to one another.

SUMMARY OF THE INVENTION

One purpose of the present invention is to provide a circuit and a read/verify method for multilevel memory cells that are free from the drawbacks described above.

According to the present invention, there are provided a read/verify circuit for multilevel memory cells with ramp read voltage and a read/verify method comprising a read terminal selectively connectable to a plurality of array cells, having respective array threshold voltages; a plurality of reference cells, having respective reference threshold voltages; a plurality of threshold-detection circuits, for detecting said array thresholds and said reference thresholds, said read terminal and said reference cells being connected each to a respective threshold-detection circuit; wherein each said threshold-detection circuit comprises a respective detector element of a resistive type, arranged so as to be traversed by a current in response to the turning-on of the respective array cell or reference cell associated thereto.

BRIEF DESCRIPTION OF THE DRAWINGS

For a better understanding of the invention, there are now described some embodiments, provided purely by way of non-limiting example and with reference to the attached drawings, in which:

FIG. 4 is a more detailed electrical diagram of a detail of FIG. 2;

FIG. 5 illustrates a variant of the detail of FIG. 2;

FIG. 7 is a more detailed electrical diagram of a detail of FIG. 6.

DETAILED DESCRIPTION

Figure 1:
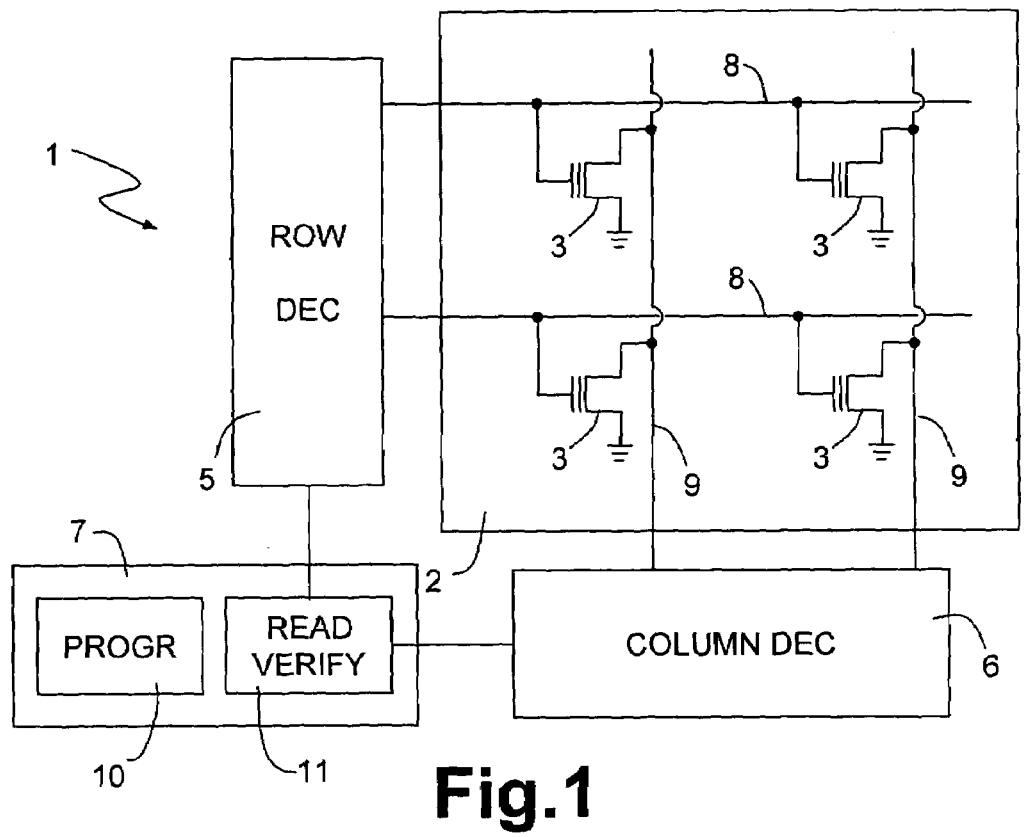
FIG. 1 is a simplified block diagram of a storage device.
Figure 2:
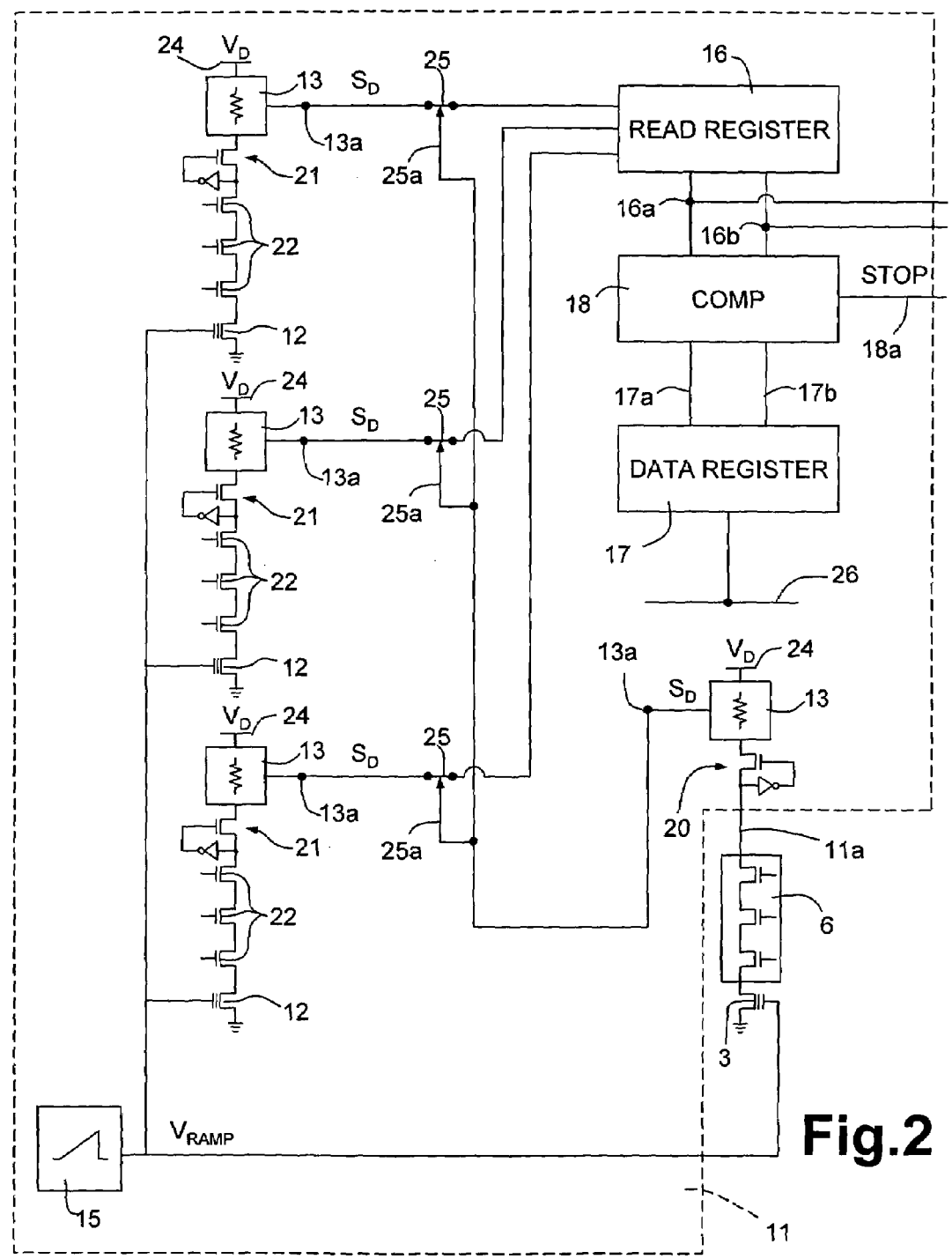
FIG. 2 is a simplified electrical diagram of a read/verify device incorporated in the device of FIG. 1 and made according to a first embodiment of the present invention.

In FIG. 1, a multilevel non-volatile storage device, for example, of a flash, EPROM or EEPROM type is designated as a whole by the reference number 1. The device 1 comprises a memory array 2, formed by a plurality of array cells 3 organized in rows and columns, a row decoder 5, a column decoder 6, and a program-read circuit 7. The array cells 3 have N storage levels and are thus able to store a number of bits B equal to $\text{Log}_2 N$ (for example, N=4, B=2). Furthermore, array cells 3 arranged on the same row are connected by the same wordline 8, and array cells 3 arranged on the same column are connected to the same bitline 9. The row decoder 5 and the column decoder 6, both of a known type, are configured so as to selectively connect a wordline 8 and, respectively, a bitline 9 (or a set of bitlines 9) addressed for programming and reading operations to the program-read circuit 7. The program-read circuit 7 comprises a programming circuit 10, of a known type, and a read/verify circuit 11, which is illustrated in greater detail in FIG. 2.

In particular, the read/verify circuit 11 comprises N−1 reference cells 12, N threshold detectors 13, a read-voltage generator 15, a read register 16, a data register 17 and a comparator circuit 18. Furthermore, a read terminal 11a of the read/verify circuit 11 is selectively connectable to an array cell 3 selected for operations of programming/verifying or reading by means of the column decoder 6, of which only three transistors corresponding to three different decoding levels are visible in FIG. 2.

Figure 3:
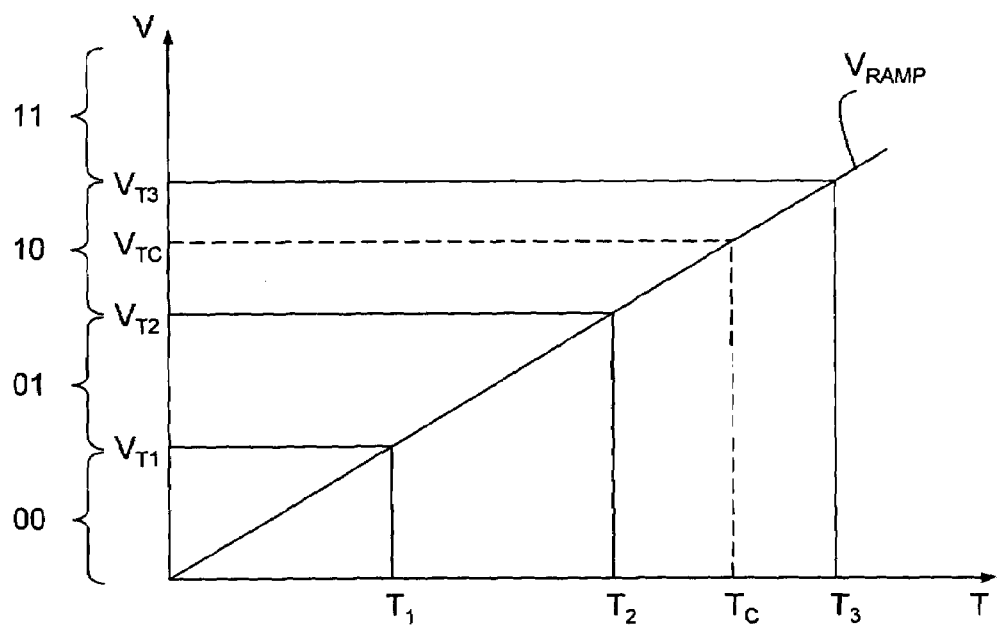
FIG. 3 is a graph showing the plot of quantities corresponding to the read/verify device of FIG. 1.

The reference cells 12 are programmed so as to have respective threshold voltages staggered with respect to the N levels of threshold voltage envisaged for the array cells 3 (see also FIG. 3). The gate terminals of the reference cells 12 and of the array cell 3 are connected to an output terminal of the voltage generator 15, on which a ramp read voltage $V_{RAMP}$, having pre-determined duration and slope, is supplied; the source terminals, instead, are grounded.

One of the threshold detectors 13, which are identical to one another, is selectively connectable to the drain terminal of the selected array cell 3 through a cascode voltage limiter 20, in itself known, the read terminal 11a, and the column decoder 6. The voltage limiter 20 guarantees correct biasing of the array cell 3. The other N−1 threshold detectors 13 are each connected to the drain terminal of a respective reference cell 12. In greater detail, between the threshold detectors 13 and the reference cells 12 there are connected cascode voltage limiters 21 and sets of "dummy" transistors 22 always turned on, for balancing the structure of the read/verify circuit 11 with respect to the circuit branch that includes the array cell 3 and the column decoder 6. All the threshold detectors 13 are moreover connected to a supply line 24, supplying a supply voltage $V_D$, and have respective outputs 13a. In particular, the outputs 13a supply respective detection signals $S_D$, which have a first logic value and a second logic value (low and high, respectively) and switch when the corresponding reference cell 12 or array cell 3 starts conducting. Furthermore, the outputs 13a of the threshold detectors 13 associated with the reference cells 12, are connected to the read register 16 through respective switches 25, e.g. respective PMOS transistors. The output 13a of the threshold detector 13 associated with the array cell 3 is instead connected to control terminals 25a of all the switches 25. In particular, the switches 25 are initially closed, when the array cell 3 is inhibited, and open all simultaneously upon turning-on of the array cell 3, when the corresponding detection signal $S_D$ switches.

The read register 16 has a number of bits equal at least to B (two in the example illustrated herein) and is incremented every time the detection signal $S_D$ supplied by one of the threshold detectors 13 associated to the reference cells 12 switches, provided, obviously, that the switches 25 are closed. The configuration of bits stored in the read register 16 is presented on its outputs 16a, 16b, which are moreover connected to the comparator circuit 18. Clearly, the number of outputs 16a, 16b of the read register 16 is equal to the number of bits B that can be stored. Also the data register 17 has a number of bits equal to B and has as many outputs 17a, 17b connected to the comparator circuit 18. Furthermore, the data register 17 is connected to a data bus 26, of a conventional type, by which, before each programming operation, data to be programmed in the array cell 3 selected is loaded.

The comparator circuit 18, which is a logic circuit and is used during the programming operations, compares bit by bit data stored in the read register 16 and in the data register 17. When said data coincide, the comparator circuit 18 supplies on its output 18a a control signal STOP to interrupt the programming operation in progress.

To carry out a verify operation, which, as is known, is a step of a cell programming operation, the read register 16 is preliminarily initialized. Furthermore, at start of the programming operation, data to be stored in the memory cell 3 selected had been previously loaded in the data register 17. Next, the read-voltage generator 15 is activated in a known way. The ramp read voltage $V_{RAMP}$ is initially low and hence the selected array cell 3 and the reference cells 13 are all cut off. Furthermore, the detection signal $S_D$ supplied by the threshold detector 13 connected to the array 3 closes the switches 25. As the read voltage $V_{RAMP}$ grows, the reference cells 13 and the array cell 3 turn on in sequence, as soon as the respective threshold voltages are exceeded, and their turning-on is recognized by the corresponding threshold detectors 13. Switching of the detection signals $S_D$ provided by the threshold detectors 13 associated with the reference cells 12 increments the logic value stored in the read register 16 until the array cell 3 turns on. At this point, in fact, the detection signal $S_D$ supplied by the threshold detector 13 associated with the array cell 3 switches and opens the switches 25, thereby "freezing" the configuration of the read register 16, which cannot be modified any further.

For greater clarity, reference may be made to the example of FIG. 3, where $V_{TC}$ indicates the threshold voltage of the selected memory cell 3 and $V_{T1}$, $V_{T2}$, $V_{T3}$ are the respective threshold voltages of the reference cells 12 (it is to be recalled that, in the embodiment described, the number of storage levels of the array cells 3 is N=4 and hence N−1=3 reference cells 12 are present). As the read voltage $V_{RAMP}$ increases, in two successive instants $T_1$, $T_2$, the detection signals $S_D$ corresponding to the reference cells 12 having respective threshold voltages $V_{T1}$, $V_{T2}$ lower than the threshold voltage $V_{TC}$ of the selected array cell 3, switch. Starting from the initial configuration ("00" in the example), the read register 16 at first goes into a first intermediate configuration ("01") at the instant $T_1$, and then into a second intermediate configuration ("10") at the instant $T_2$. When the ramp voltage $V_{RAMP}$ exceeds the threshold voltage $V_{TC}$ of the array cell 3 (instant $T_C$), the detection signal $S_D$ corresponding to the array cell 3 switches, opens the switches 25 and "freezes" the read register 16. Consequently, when the detection signal $S_D$ corresponding to the reference cell switches (instant $T_3$), the content of the read register 16 is not any further modified and its final configuration is the same as the second intermediate configuration ("10").

Finally, the comparator circuit 18 compares the data stored in the read register 16 with the data loaded in the data register 17 and, when said data coincide, generates the control signal STOP, which concludes the programming operation in progress.

A read operation is carried out in an altogether similar way, but does not envisage the step of comparing the contents of the read register 16 and of the data register 17.

FIG. 4 illustrates in detail one of the threshold detectors 13, which, in particular, is connected to one of the reference cells 12. As mentioned previously, all the threshold detectors 13, both those associated with the reference cells 12 and those associated with the selected array cell 3 are identical to one another. The threshold detector 13 comprises a voltage regulator 30, a detector element 31, and a logic inverter 32, having a triggering voltage $V_S$.

The voltage regulator 30 comprises a regulating transistor 35, of an NMOS type, and a reference-voltage generator 36, supplying a reference voltage $V_{REF}$ irrespective of the supply voltage $V_D$. In particular, the regulating transistor 35 has its drain terminal connected to the supply line 24 and its gate terminal connected to the reference-voltage generator 36 for receiving the reference voltage $V_{REF}$. Furthermore, a source terminal of the regulating transistor 35 forms an output 30a of the voltage regulator 30 and supplies a constant regulated voltage $V_{REG}=V_{REF}-V_{TR}$, where $V_{TR}$ is the threshold voltage of the regulating transistor 35. Preferably, the regulated voltage $V_{REG}$ is only a little higher than the triggering voltage $V_S$ of the logic inverter 32. Alternatively, the gate terminals of all the regulating transistors 35 are connected to the same reference-voltage generator.

The detector element 31 is of a resistive type and has a first terminal connected to the output 30a of the voltage regulator 30 and a second terminal connected to a detection node 33, to which there is connected also the corresponding voltage limiter 21. Furthermore, the detector element 31 is sized so that the passage of an even very low current, for example, 1-2 μA, will bring down the voltage on the detection node 33 below the triggering voltage $V_S$ of the logic inverter 32.

The logic inverter 32, for example, of a CMOS type, has an input connected to the detection node 33 and an output which forms the output 13a of the threshold detector 13 and supplies the respective detection signal $S_D$.

At the start of a read or verify step, the selected array cell 3 and the reference cells 12 are turned off and do not conduct, as has already been explained. In these conditions, the voltage on the detection node 33 is higher than the triggering voltage $V_S$, hence the detection signal $S_D$ has the first logic value (low). The reference cell 12 associated with the threshold detector of FIG. 4 turns on as soon as the read voltage $V_{RAMP}$ exceeds its threshold voltage (for example, the threshold voltage $V_{T2}$). Consequently, the same current I starts flowing through the reference cell 12 and the detector element 31, the voltage on the detection node 33 rapidly drops below the triggering voltage $V_S$ of the logic inverter 32, and the detection signal $S_D$ switches to the second logic value (high) almost instantaneously. In practice, then, the detector element 31 timely detects overstepping of the threshold voltage ($V_{T2}$ in this case), so causing a reduction in the voltage on the detection node 33. The logic inverter 32, which is used as trigger detector with a single detection input and an intrinsic triggering threshold, amplifies this variation to confirm detection.

The advantages of the invention are clear from the foregoing description. In the first place, the read/verify circuit described is extremely sensitive and precise and hence enables discrimination of threshold voltages that are very close to one another. Consequently, the number of storage levels of each cell can be increased, without jeopardizing reading precision. This result is due principally to the structure of the threshold detectors 13, which are of simple construction and do not envisage the use either of operational amplifiers or of reference-current generators. Consequently, also the need for providing current mirrors, which are particularly critical, is overcome. The described read/verify circuit is free from offset problems thanks to the use of the inverters and, moreover, is substantially immune from fluctuations of the supply voltage. In particular, the absence of current-mirror circuits and the use of the reference-voltage generators that are independent of the supply voltage and of the corresponding voltage regulators enables compensation of oscillations even of a considerable intensity. The read/verify circuit according to the invention is moreover compact and occupies a minimal area.

According to a variant of the invention (illustrated in FIG. 5), threshold detectors 113 comprise a voltage regulator 30 and a detector element 31 of a resistive type, as already described, and are moreover provided with a monostable circuit 132 having a triggering threshold $V_S'$. The monostable circuit 132 has a detection input connected to the respective detection node 33, and its output forms an output 113a of the corresponding threshold detector 113. Furthermore, the monostable circuit 132 supplies a detection signal $S_D'$, which has the form of a pulse of pre-set duration and is generated when the voltage on the detection node 33 drops below the triggering threshold $V_S'$. Also the monostable circuits 132, like the logic inverters 32, consequently function as detectors triggering with a single detection input and an intrinsic triggering threshold.

Figure 6:
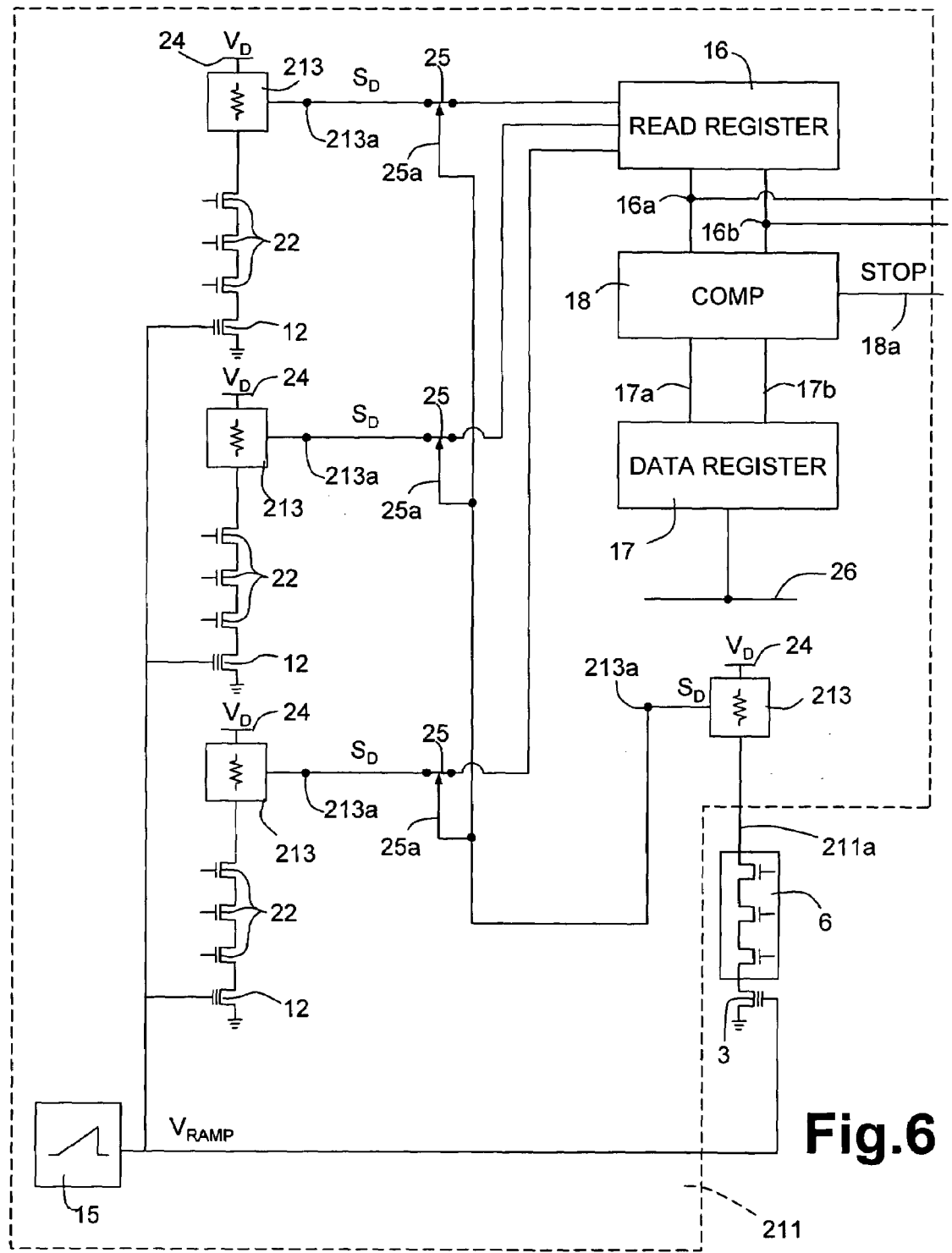
FIG. 6 is a simplified electrical diagram of a read/verify device made according to a further embodiment of the present invention.

FIGS. 6 and 7, in which parts that are the same as those already described are designated by the same reference numbers, show a further embodiment of the invention. In this case, a read/verify circuit 211 has substantially the same structure as the read/verify circuit 11 of FIG. 2, but comprises threshold detectors 213 instead of the threshold detectors 13. Furthermore, the threshold detectors 213 associated with the reference cells 12 are directly connected to the "dummy" transistors 22, and the threshold detector 213 associated with the selected array cell 3 is directly connected to the read terminal 211a (in practice, the voltage limiters 20, 21 are missing). One of the threshold detectors 213, which are identical to one another, is illustrated in detail in FIG. 7 and comprises the voltage regulator 30, the detector element 31 and a logic inverter 232, having an input connected to the detection node 33. In particular, the logic inverter 232 is a CMOS logic inverter, which includes a PMOS transistor 234 and a natural NMOS transistor 235, and is thus unbalanced to ground.

The read/verify circuit of FIGS. 6 and 7 is advantageously even simpler and more compact and is particularly suited for being used with very low supply voltages (for example, 1.8 V). In this case, in fact, the absence of the voltage limiters does not jeopardize biasing of the array cells or reference cells, and hence operation of the circuit remains in any case optimal. Furthermore, unbalancing of the logic inverter 232 favours correct discrimination of the threshold in low-voltage conditions.

Finally, it is evident that modifications and variations may be made to the device and the method described herein, without thereby departing from the scope of the present invention as defined in the annexed claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A read/verify circuit for multilevel memory cells, the circuit comprising:
   a read terminal selectively connectable to an array cell of a plurality of array cells, the array cell having an array cell threshold voltage;
   a plurality of reference cells having respective reference threshold voltages;
   a plurality of threshold-detection circuits including a first threshold-detection circuit for detecting said array cell threshold voltage and a set of reference threshold-detection circuits for detecting said reference threshold; voltages, each threshold-detection circuit comprising a resistor as a detector element, arranged so as to be traversed by a current in response to a turning-on of either the array cell or one of the reference cells connected thereto;

a ramp-voltage generator for providing a ramp read voltage, the ramp voltage generator connected to respective control terminals of said reference cells and the array cell of the plurality of array cells; and a read register coupled to said set of reference threshold-detection circuits, the turning on of each reference cell triggering modification of the read register until the array cell turns on.

2. The circuit according to claim 1, wherein each of said threshold-detection circuits further comprises a voltage regulator coupled to said detector element for supplying a constant regulated voltage on a first terminal of said detector element.

3. The circuit according to claim 2, wherein each of said voltage regulators comprises a regulating transistor having a gate terminal connected to a reference-voltage generator supplying a reference voltage, a source terminal connected to said first terminal of the detector element and supplying said regulated voltage, and a drain terminal connected to a supply line.

4. The circuit according to claim 2, wherein each of said threshold-detection circuits comprises a triggering detector means coupled to a second terminal of the detector element.

5. The circuit according to claim 4, wherein said triggering detector means have an intrinsic triggering threshold, a detection input connected to said second terminal of the respective detector element, and an output supplying a signal correlated to a voltage on said second terminal and with said intrinsic triggering threshold.

6. The circuit according to claim 5, wherein said triggering detector means comprise a logic inverter.

7. The circuit according to claim 6, wherein said triggering detector means comprise a CMOS inverter including a natural NMOS transistor.

8. The circuit according to claim 5, wherein said triggering detector means comprise a monostable circuit.

9. A read/verify circuit for multilevel memory cells, the circuit comprising:

a read terminal selectively connectable to an array cell of a plurality of array cells, the array cell having an array cell threshold voltage;

a plurality of reference cells having respective reference threshold voltages;

a plurality of threshold-detection circuits including a first threshold-detection circuit for detecting said array cell threshold voltage and a set of reference threshold-detection circuits for detecting said reference threshold voltages, wherein each threshold-detection circuit comprises a detector element of a resistive type, arranged so as to be traversed by a current in response to a turning-on of either the array cell or one of the reference cells connected thereto, the read/verify circuit further comprising:

a read register coupled to said set of reference threshold-detection circuits, the read register being modified in response to a turning-on of respective reference cells; and a plurality of switches connected between said read register and the set of reference threshold detection circuits, said switches being driven by said first threshold detector circuit so as to decouple said read register and said set of reference threshold detector circuits in response to a turning-on of said array cell.

10. The circuit according to claim 1, comprising a first voltage limiter, arranged between said read terminal and the respective voltage detector, and second voltage limiters, each arranged between a voltage detector and the respective reference cell.

11. A multilevel memory device, comprising a memory array including a plurality of multilevel array cells, comprising a read/verify device according to claim 1.

12. A read/verify method for multilevel memory cells comprising:

selecting an array cell from a plurality of array cells, the array cell having an array cell threshold voltage;

applying a ramp read voltage to said selected array cell and to a plurality of reference cells having respective reference threshold voltages; and detecting said array cell threshold voltage and said reference threshold voltages;

wherein detecting comprises connecting respective resistors to said selected array cell and to each of said reference cells so that each of said detector elements is traversed by a current in response to a turning-on of either the array cell or one of the reference cells connected thereto and triggering modification of a read register for each reference cell turned on until the array cell turns on.

13. The method according to claim 12, further comprising supplying a constant regulated voltage on a first terminal of respective resistors as detector elements.

14. The method according to claim 12, further comprising decoupling switches connected between said read register and the set of reference cells in response to the turning on of the array cell.

* * * * *